US006627385B2

(12) United States Patent
Hiller et al.

(10) Patent No.: US 6,627,385 B2
(45) Date of Patent: Sep. 30, 2003

(54) USE OF GRAFT COPOLYMERS FOR THE PRODUCTION OF LASER-ENGRAVABLE RELIEF PRINTING ELEMENTS

(75) Inventors: Margit Hiller, Karlstadt (DE); Alfred Leinenbach, Ludwigshafen (DE); Uwe Stebani, Flörsheim-Dalsheim (DE); Wolfgang Wenzl, Mannheim (DE)

(73) Assignee: BASF Drucksysteme GmbH, Stuttgart (DE)

( * ) Notice: Subject to any disclaimer, the term of this patent is extended or adjusted under 35 U.S.C. 154(b) by 209 days.

(21) Appl. No.: 09/814,738

(22) Filed: Mar. 23, 2001

(65) Prior Publication Data

US 2001/0044076 A1 Nov. 22, 2001

(30) Foreign Application Priority Data

Mar. 23, 2000 (DE) ........................................ 100 14 049
Aug. 18, 2000 (DE) ........................................ 100 40 926

(51) Int. Cl.[7] ................................................ G03F 7/039

(52) U.S. Cl. ................. 430/306; 430/273.1; 430/275.1; 430/286.1; 430/287.1; 430/288.1; 430/348; 430/944; 430/945

(58) Field of Search ........................... 430/270.1, 271.1, 430/273.1, 281.1, 286.1, 287.1, 288.1, 300, 302, 306, 307, 348, 944, 945, 964, 275.1

(56) References Cited

U.S. PATENT DOCUMENTS

| | | | | | |
|---|---|---|---|---|---|
| 4,849,307 | A | | 7/1989 | Hoffmann et al. | 430/271 |
| 5,055,377 | A | * | 10/1991 | Littmann et al. | 430/271 |
| 5,259,311 | A | | 11/1993 | McCaughey, Jr. | 101/401.1 |
| 5,798,202 | A | | 8/1998 | Cushner et al. | 430/306 |
| 6,037,102 | A | * | 3/2000 | Loerzer et al. | 430/306 |
| 6,214,521 | B1 | * | 4/2001 | Telser et al. | 430/281.1 |
| 6,245,481 | B1 | * | 6/2001 | Teng | 430/270.1 |
| 6,284,431 | B1 | * | 9/2001 | Tanizaki et al. | 430/273.1 |
| 6,352,815 | B1 | * | 3/2002 | Feil et al. | 430/306 |
| 6,355,395 | B1 | * | 3/2002 | Zwez et al. | 430/271.1 |
| 2001/0053498 | A1 | * | 12/2001 | Fujimoto et al. | 430/273.1 |
| 2002/0115019 | A1 | * | 8/2002 | Kaczun et al. | 430/273.1 |

FOREIGN PATENT DOCUMENTS

| | | |
|---|---|---|
| CA | 2229003 | 12/1997 |
| CA | 2279370 | 7/1999 |
| EP | 0 224 164 | 6/1987 |
| EP | 640 043 B1 | 3/1996 |
| EP | 640 044 B1 | 3/1996 |
| EP | 0 767 407 | 4/1997 |
| EP | 710 573 B1 | 3/1999 |
| WO | WO 93/23252 | 11/1993 |

OTHER PUBLICATIONS

Technik des Flexodrucks, 172ff,4thEd, 1999,Coatings.
OZ0087/00016=U.S.Ser.No. 09/382,149.

* cited by examiner

*Primary Examiner*—Janet Baxter
*Assistant Examiner*—Barbara Gilliam
(74) *Attorney, Agent, or Firm*—Keil & Weinkauf

(57) ABSTRACT

Graft copolymers are used for the production of laser-engravable relief printing plates, the graft copolymers being obtained by free radical polymerization of vinyl esters in the presence of polyalkylene oxides and subsequent hydrolysis of the ester function. Processes for the production of transparent flexographic printing plates by means of laser engraving using said graft copolymers are described.

8 Claims, No Drawings

USE OF GRAFT COPOLYMERS FOR THE PRODUCTION OF LASER-ENGRAVABLE RELIEF PRINTING ELEMENTS

The present invention relates to the use of graft copolymers for the production of laser-engravable relief printing plates, the graft copolymers being obtained by free radical polymerization of vinyl esters in the presence of polyalkylene oxides and subsequent hydrolysis of the ester function. It furthermore relates to a process for the production of transparent flexographic printing plates by means of laser engraving using said graft copolymers, and to a process for the production of flexographic printing plates on metallic substrates by means of laser engraving using said graft copolymers.

The conventional method for the production of flexographic printing plates starting from unexposed photopolymerizable plates comprises a plurality of process steps, such as exposure of the back, imagewise exposure to actinic light, washout, drying, aftertreatment and subsequent drying at room temperature, and is overall a relatively time-consuming process. Depending on the thickness of the plate, usually up to 24 hours are required for the production of a ready-to-print flexographic printing plate from an unexposed photopolymer plate.

There has therefore been no lack of attempts to replace this time-consuming method by other methods, for example by direct laser engraving, in particular using IR lasers, for example $CO_2$ lasers or Nd—YAG lasers. Indentations are engraved with the aid of a sufficiently powerful laser directly in a plate suitable for this purpose, with the result that in principle a relief suitable for printing is formed. Direct laser engraving has in principle a number of further advantages. For example, the shape of the relief can be freely chosen. Whereas in photopolymer plates the sidewalls of a relief dot divert continuously from the surface to the relief base, the sidewall shape can be freely chosen in the case of laser-engraved plates. For example, a sidewall which descends perpendicularly or virtually perpendicularly in the upper region and broadens only in the lower region is usual. Consequently, there is at most a small increase in tonal value, if any at all, even with increasing wear of plate during the printing process. A further advantage is that the image information can be transferred in digital form directly from the layout computer to the laser apparatus, so that the production of a photographic mask for image production is superfluous. Further details of laser engraving methods are given, for example, in Technik des Flexodrucks, page 173 et. seq., 4th Edition, 1999, Coating Verlag, St. Gallen, Switzerland.

In practice, however, those skilled in the art are confronted by a number of problems in implementing the concept of direct laser engraving.

In direct laser engraving, large amounts of the material of which the printing relief consists have to be removed by the laser. A typical flexographic printing plate is, for example, from 0.5 to 7 mm thick and the nonprinting indentations on the plate are from 300 $\mu$m to 3 mm deep. On the apparatus side, sufficiently powerful lasers must therefore be available in order to be able to engrave as economically as possible. Moreover, the lasers must be very accurately focusable in order to ensure high resolution.

Furthermore, it is decisive for the cost efficiency of the process that the sensitivity of the material of which the printing relief consists to laser radiation is very high so that the material can be engraved rapidly.

The elastomeric binders typically used for the production of flexographic printing plates, for example SIS or SBS block copolymers, are in principle sensitive to laser radiation. Such binder-containing recording elements for production of flexographic printing plates by laser engraving are disclosed, for example, in EP-A 640 043 and EP-A 640 044. However, the sensitivity to laser radiation is only moderate. There is therefore still a need to provide binders having higher sensitivity to laser radiation.

It has therefore also been proposed to add to the relief layers materials which absorb laser radiation, in order to increase the sensitivity to laser radiation, for example in DE-A 196 25 749, EP-A 710 573 or EP-A 640 043. In particular, carbon black has been proposed as an absorbing material. Here, however, it should be noted that the laser-engravable layer must also have the performance characteristics important for relief printing plates, for example resilience, hardness, roughness, ink acceptance or low swellability in printing inks, which might be adversely effected by fillers. The optimization of the material with respect to optimum engravability by lasers by the addition of absorbing materials is therefore subject to limits. Moreover, fillers cause conventional, photopolymer, flexographic printing plates to lose their transparency, which complicates mounting with accurate register, since register crosses or similar marks are no longer visible through the plate. Special mounting apparatuses have to be used for filler-containing plates.

Furthermore, opaque plates filled with carbon black or similarly highly absorbing material can no longer be crosslinked by means of photopolymerization, or at most only in the case of very small layer thicknesses. However, this is associated with two serious disadvantages: on the one hand, those skilled in the art have wide knowledge of the relationship between production parameters and properties of the resulting printing plates concerning precisely the production of flexographic printing plates by means of photopolymerization, which knowledge can now no longer be utilized. On the other hand, when thermoplastic elastomers are used, photopolymer plates can be produced in an elegant manner by extrusion and calendering at elevated temperatures using thermally stable photoinitiators. This production method is at least more difficult in the case of thermal crosslinking.

It is therefore entirely desirable to use suitable elements without fillers, for the production of flexographic printing plates by laser engraving.

Particularly important with respect to the quality of the printing relief obtained by laser engraving is that the material be converted directly into the gas phase, as far as possible without prior melting, on exposure to laser radiation. If this is not the case, fused edges form around the indentations on the plate. Such fused edges lead to a considerable deterioration in the printed image and reduce the resolution of the printing plate and of the printed image. It is precisely the flexographic recording element comprising typical elastomeric binders, for example SIS or SBS block copolymers, which have a strong tendency, with or without the addition of laser-absorbing materials, to form fused edges.

To solve this problem, U.S. Pat. No. 5,259,311 has proposed that, after the laser engraving, the plate obtained be subsequently cleaned with solvents and then dried again. This involves the use of apparatuses and washout media which are usually envisaged for the development of exposed flexographic printing plates. Although fused edges can be removed by the aftertreatment described and improved flexographic printing plates can be obtained, the abovementioned time advantage of laser engraving compared with the conventional production of the plate is substantially lost.

In addition to block copolymers, SIS or SBS rubbers, in photopolymerizable flexographic printing plates developable in organic media, the use of polyvinyl alcohols or polyvinyl alcohol derivatives for the production of photopolymer relief printing plates developable in aqueous media is also known. The laser engraving of the relief printing plates comprising such polymers is also known. DE-A 198 38 315 discloses a laser-engravable recording element which contains polyvinyl alcohol or polyvinyl alcohol derivatives in the relief layer. Furthermore, the recording elements disclosed therein contain particulate, polymeric fillers having a low ceiling temperature, i.e. fillers depolymerizable at comparatively low temperatures, for improving the sensitivity to lasers. Although polyvinyl alcohols can be engraved by means of $CO_2$ lasers even without the addition of fillers, the speed of the laser engraving is only slow.

It is an object of the present invention to provide laser-engravable recording elements which have a very high sensitivity to laser radiation and can be engraved without fused edges by means of lasers.

We have found that this object is achieved and that surprisingly, specific graft copolymers can be very readily used for the production of laser-engravable recording elements. Such recording elements both have a considerable above-average sensitivity to laser radiation and are laser-engravable without the production of fused edges.

Accordingly, we have found the use of the graft copolymers described at the outset, which can be obtained by free-radical polymerization of vinyl esters in the presence of polyalkylene oxides and subsequent hydrolysis of at least some of the ester functions, for the production of laser-engravable relief printing plates, and a process for the production of transparent flexographic printing plates by laser engraving using such graft copolymers.

In the preparation of the graft copolymers used according to the invention, grafting onto the polyalkylene oxides preferably occurs. However, there are also other possible grafting mechanisms. The graft copolymers to be used according to the invention are to be understood as meaning both pure graft copolymers and mixtures of graft copolymers with residues of ungrafted polyalkylene oxides and at least partially hydrolyzed polyvinyl esters.

The graft copolymers used according to the invention are prepared in a first reaction stage by polymerizing vinyl esters in the presence of polyalkylene oxides and a free radical polymerization initiator. In a second reaction stage, at least some of the ester groups in the graft copolymer obtained may be hydrolyzed to vinyl alcohol structural units. Such graft copolymers, their preparation and properties are disclosed, for example, in EP-A 224 164, which is hereby expressly incorporated by reference.

Particularly suitable polyalkylene oxides are polymers based on ethylene oxide, propylene oxide and butylene oxide and random copolymers or block copolymers thereof. The copolymers preferably contain at least 50 mol % of ethylene oxide. Polyethylene oxide is particularly preferred. The terminal OH groups of the polyalkylene oxides may also be modified, for example esterified or etherified. In addition to the straight-chain polyalkylene oxides, it is also possible to use branched ones. Branched polyalkylene oxides can be obtained by subjecting ethylene oxide and/or other alkylene oxides to an addition reaction with, for example, polyalcohols, such as glycerol. It is also possible to use polyalkylene oxides which also contain small amounts of further chain components. Examples are carbon groups which are obtainable by reacting polyalkylene oxides with phosgene, or urethane groups, which are obtainable by reacting polyalkylene oxides with aliphatic or aromatic diisocyanates. However, the amount of such additional chain components should as a rule not exceed 5 mol %, based on the total amount of the chain components.

The number average molecular weights $M_n$ of the polyalkylene oxides used are in general from 5,000 to 100,000, preferably from 10,000 to 50,000, g/mol.

Examples of vinyl esters for the synthesis of the grafted-on side groups are in particular the vinyl esters of aliphatic $C_1$-$C_{24}$-monocarboxylic acids. Vinyl acetate and vinyl propionate are preferred, vinyl acetate being particularly preferred.

In a particular embodiment, one or more additional, ethylenically unsaturated monomers may be used as well as the vinyl esters. In this way, the properties of the grafted-on side chains can be influenced in a specific manner. However, the amount of these additional monomers should not exceed 20 mol %, based on the total amount of the monomers used. From 0 to 5 mol % are preferred. Acidic monomers, such as acrylic acid or methacrylic acid, and basic monomers, such as vinyl formamide or 1-vinylimidazole, may be mentioned by way of example.

The peroxo and/or azo compounds usual for this purpose, for example dibenzoyl peroxide, tert-butyl perbenzoate or azobisisobutyronitrile, may be used as initiators for the free radical polymerization. The amounts of initiator or initiator mixtures used are from 0.01 to 10, preferably from 0.5 to 2, % by weight, based on the vinyl esters or further monomers.

The polymerization of the vinyl ester and optionally further monomers in the presence of polyalkylene oxides is advantageously carried out at from 50 to 150° C., preferably from 80 to 120° C. It can be carried out by methods known to those skilled in the art, in solvents or in the absence of solvents. Particularly advantageously, the polymerization can be carried out in the molten polyalkylene oxide, in the absence of a solvent. Suitable embodiments of the polymerization are disclosed in EP-A 224 164.

The amount of grafted-on vinyl ester and optionally further monomers is in general from 30 to 400, preferably from 30 to 80 mol %, based on the sum of all monomeric units in the graft copolymer.

In the second reaction stage, at least some of the ester groups in the graft copolymer obtained can be hydrolyzed in a known manner to give vinyl alcohol structural units. For example, sodium hydroxide solution or potassium hydroxide solution can be used for this reaction step. It is also possible to remove the carboxyl groups by transesterification, for example with a methanolic NaOH solution, vinyl alcohol groups and methyl acetate being formed.

The degree of hydrolysis is chosen by those skilled in the art in accordance with the desired properties of the polymer. As a rule, at least 50, preferably at least 65, mol % of the vinyl ester structural units in the graft copolymer are hydrolyzed. The degree of hydrolysis is particularly preferably from 80 to 98%.

In a further process step, vinyl alcohol groups obtained by hydrolysis of the ester function can optionally be reacted with compounds which contain olefinic groups. This produces graft copolymers which contain additional, polymerizable side groups. The reaction can be carried out in a known manner using esters, chlorides or preferably anhydrides of olefinically unsaturated carboxylic acids, for example acrylic acid, methacrylic acid or maleic acid. Regarding the procedure, reference may be made, for example to EP-A 129 901. If present, a content of olefinic side groups of from about 2 to 20 mol %, based on the total amount of the vinyl ester or vinyl alcohol units is advantageous.

The properties of the graft copolymers used according to the invention can be modified by a person skilled in the art, for example by the choice of type and amount of the additional, ethylenically unsaturated monomers or by said additional functionalization, and can be adapted to the respective intended use. For example, graft copolymers which have elastomeric properties may also be used. In the case of the novel use of the graft copolymers, the latter are employed in laser-engravable elements for the production of relief printing plates, such as letterpress, flexographic or gravure printing plates, in particular flexographic printing plates and very particularly transparent flexographic printing plates or flexographic printing plates on metallic substrates.

In the laser-engravable elements, a laser-engravable layer is applied to a dimensionally stable substrate, if necessary by means of an adhesion-promoting layer. Examples of suitable dimensionally stable substrates are sheets, films and conical and cylindrical sleeves of metals, such as steel, aluminum, copper or nickel, or of plastics, such as polyethylene terephthalate (PET), polyethylene naphthalate (PEN), polybutylene terephthalate, polyamide or polycarbonate, and, if required, also woven fabrics and nonwovens, such as glass fabrics, and composite materials comprising glass fibers and plastics.

Particularly suitable dimensionally stable substrates, especially for transparent flexographic printing plates, are dimensionally stable substrate films, for example polyester films, in particular PET or PEN films.

Flexible metallic substrates are particularly advantageous. For the purposes of this invention, flexible is to be understood as meaning that the substrates are so thin that they can be bent around printing cylinders. On the other hand, they are also dimensionally stable and sufficiently thick that the substrate is not buckled during the production of the laser-engravable element or the mounting of the finished printing plate on the printing cylinder.

Particularly suitable flexible metallic substrates are thin metal sheets or metal foils of steel, preferably of stainless steel, magnetizable spring steel, aluminum, zinc, magnesium, nickel, chromium or copper, it also being possible for the metals to be alloyed. Combined metallic substrates, for example steel sheets coated with tin, zinc, chromium, aluminum, nickel or a combination of different metals, or those metal substrates which are obtained by lamination of metal sheets of the same type or of different types, may also be used. Furthermore, pretreated metal sheets, for example phosphated or chromatized steel sheets or anodized aluminum sheets, may also be used. Usually, the metal sheets or foils are degreased before use. Substrates comprising steel or aluminum are preferably used, magnetizable spring steel being particularly preferred.

The thickness of such flexible metallic substrates is usually from 0.025 to 0.4 mm and also depends on the type of metal used, in addition to the desired degree of flexibility. Steel substrates usually have a thickness of from 0.025 to 0.25 mm, in particular from 0.14 to 0.24 mm. Aluminum substrates usually have a thickness of from 0.25 to 0.4 mm.

The term laser-engravable is to be understood as meaning that the relief layer has the property of absorbing laser radiation, in particular the radiation of an IR laser, so that it is removed or at least detached in those areas in which it is exposed to a laser beam of sufficient intensity. Preferably, the layer is evaporated or thermally or oxidatively decomposed without melting beforehand, so that its decomposition products are removed from the layer in the form of hot gases, vapors, fumes or small particles. The term transparent is to be understood as meaning that the relief layer of the laser-engravable element is substantially transparent in exactly the same way as conventional photopolymerizable flexographic printing plates, i.e. structures present underneath can be recognized with the naked eye. This does not rule out the fact that the plate may be colored to a certain extent. It is expressly pointed out here that a laser-engravable element on the metallic substrate can also be transparent in this context, i.e. can have a transparent relief layer, although such a laser-engravable element is of course not transparent as a whole.

The laser-engravable elements may also have a plurality of laser-engravable layers which are arranged one on top of the other and have different compositions. At least one of the layers contains at least one of said graft copolymers. Mixtures of different graft copolymers may also be used. However, it is preferable if each of the layers contains at least one or more or said graft copolymers.

The laser-engravable layer can moreover contain further polymeric binders different from the graft copolymers used according to the invention. Such additional binders may be used, for example, for specific control of the properties of the layer. The precondition for the addition of further binders is that they are compatible with the graft copolymer. For example, other polyvinyl alcohols or polyvinyl alcohol derivatives or water-soluble polyamides are suitable. The amount is chosen by those skilled in the art according to the desired properties of the layer. In particular, it should be noted here that the speed of the laser engraving should not be reduced, or at least not excessively, by an additional binder. As a rule, not more than 20, preferably not more than 10, % by weight, based on the total amount of the binder used, of such additional binders should therefore be used.

The laser-engravable layers are preferably crosslinked. The crosslinking of the laser-engravable layer can be effected by a chemical reaction, for example free radical or ionic polymerization, by polycondensation or by polyaddition, suitable crosslinking agents being added depending on the crosslinking reaction. It can also be carried out by means of an ion beam. Preferably, the crosslinking is effected by photochemically initiated polymerization.

The crosslinking can be carried out on the one hand without the addition of further polymerizable compounds if the graft copolymers described above and having olefinically polymerizable groups are used.

However, the graft copolymers are preferably used as a mixture with polymerizable, ethylenically unsaturated compounds compatible with the binder. It is possible to use only one such monomer or a plurality of monomers as a mixture with one another. Suitable compatible monomers are, for example, mono- and di(meth)acrylates of di- or polyalcohols, such as ethylene glycol or di-, tri-, tetra- or polyethylene glycols. Examples are ethylene glycol monoacrylate, ethylene glycol dimethacrylate or methyl polyethylene glycol monoacrylate. The amount of admixed monomers can be chosen by those skilled in the art according to the desired performance characteristics, such as hardness and resilience of the layer. If graft copolymers having olefinic side groups are used, as a rule not more than 15% by weight of additional monomers are required. If graft copolymers without olefinic side groups are used, larger amounts, though in general not more than 50% by weight, preferably from 15 to 45% by weight, are used.

For example, typical peroxides or hydroperoxides may be used as initiators for the thermal polymerization. Thermal crosslinking is initiated as a rule by heating the laser-engravable element.

For example, acyloins and their derivatives, for example benzoin, or vicinal diketones, for example benzil, can be used in a known manner as initiators for the photochemical polymerization. The photopolymerization can be initiated in the known manner by actinic light.

Furthermore, the laser-engravable recording layer may also comprise assistants and additives. Examples of such additives are dyes, colored pigments, plasticizers, dispersants or adhesion promoters. Particularly suitable plasticizers for use with the graft copolymers used according to the invention are, for example, glycerol or polyethylene glycols.

Although the novel use of the graft copolymers gives transparent, laser-engravable recording elements which have excellent sensitivity to laser radiation and can be used for the production of relief printing plates even without the addition of additives absorbing laser radiation, and furthermore dispensing with such additives is the preferred embodiment of the invention, the present invention also relates to the use of such additives. For example, alumina or hydrated alumina, or iron oxides or carbon black can be used. Consequently, the plate loses transparency and becomes opaque. The readily depolymerizable polymer particles described above, for example comprising polymethyl methacrylate (e.g. Agfaperl®), may also be used. In addition, fillers which serve other purposes can also be used. Examples here would be fine $SiO_2$ particles (e.g. Aerosil®, from Degussa) for influencing the relief properties. The latter have a particle size which is smaller than the wavelength of visible light, so that the plate remains transparent if the filler is sufficiently well dispersed.

The thickness of the laser-engravable recording layer or all recording layers together is as a rule from 0.1 to 7 mm. The thickness is suitably chosen by those skilled in the art according to the desired use of the printing plate.

Optionally, the novel recording element may also comprise a thin top layer on the laser-engravable recording layer. By means of such a top layer, important parameters such as roughness, abrasiveness, surface tension, surface tack or solvent resistance, at the surface, can be modified for the printing behavior and ink transfer without influencing those properties of the printing plate which are typical of the relief, for example hardness or resilience. Surface properties and layer properties can thus be modified independently of one another in order to obtain an optimum printed copy. The composition of the top layer is limited only in that the laser engraving of the laser-engravable layer present underneath may not be impaired and the top layer must be removable together with it. The top layer should be thin compared with the laser-engravable layer. As a rule, the thickness of the top layer does not exceed 100 $\mu$m, and is preferably from 1 to 80 $\mu$m, particularly preferably from 3 to 10 $\mu$m. Preferably, the top layer itself should be readily laser-engravable and therefore also preferably comprises, as a polymeric binder, a graft copolymer used according to the invention. In particular, those graft copolymers whose side chains were specifically modified by copolymerization of vinyl esters with further monomers, for example to improve the ink acceptance of the plate, can advantageously be used here. In addition, further polymeric binders and assistants can be used for establishing the desired properties.

Optionally, the laser-engravable element may also comprise a lower layer which is present between the substrate and the laser-engravable layer. The lower layer may be laser-engravable but it may also be non-laser-engravable. Such lower layers can be used for modifying the mechanical properties of the relief printing plates without influencing those properties of the printing plate which are typical of the relief.

Furthermore, the laser-engravable recording element can optionally be protected from mechanical damage by a cover sheet which consists, for example, of PET and is present in each case on the topmost layer and must in each case be removed prior to engraving with lasers.

The laser-engravable elements can be produced by dissolution of the components in suitable solvents and casting on the substrate, followed by evaporation of the solvent. A plurality of layers can be cast one on top of the other.

They can furthermore be produced, for example, by mixing in suitable kneaders or extruders, followed by extrusion and calendering, at elevated temperatures. The latter method is particularly advantageously used in the case of photopolymerizable systems.

Particularly when metallic substrates are used, it proven useful to cast the laser-engravable layer onto a temporary substrate, for example onto a PET film, and to dry it and then, in a second step, to laminate that side of the dried, laser-engravable layer which faces away from the temporary substrate with the flexible metallic substrate.

An optionally present top layer can either be applied in a manner known per se by casting or lamination or can be produced by coextrusion simultaneously with the laser-engravable layer.

The photochemical crosslinking can advantageously be carried out by exposure to actinic light directly after formation of the laser-engravable printing plate. However, it is also possible not to carry out the crosslinking until a later time. The exposure to light can be effected from just one side or from both sides.

The thermal crosslinking is effected by heating the laser-engravable element.

The laser-engravable elements produced with the novel use of graft copolymers serve as starting material for the production of relief printing plates. The process comprises first removing the cover sheet, if present. In the following process step, a printing relief is engraved in the recording material by means of a laser. Advantageously, image elements whose side walls initially descend perpendicularly and broaden only in the lower region of the image elements are engraved. As a result, firm anchoring of the image dots but with low dot gain is achieved. However, it is also possible to engrave image dot side walls of other configurations.

Lasers particularly suitable for laser engraving are $CO_2$ lasers having a wavelength of 10640 nm as well as Nd—YAG lasers (1064 nm) and IR diode lasers or solid-state lasers which typically have wavelengths from 700 to 900 nm and from 1200 to 1600 nm. However, it is also possible to use lasers having shorter wavelengths, provided that the laser has sufficient intensity. For example, a frequency-doubled (532 nm) or frequency-tripled (355 nm) Nd—YAG laser or excimer laser (e.g. 248 nm) can also be used. The image information to be engraved is transferred directly from the layout computer system to the laser apparatus. The laser operation can be either continuous or pulsed.

The novel process has the major advantage that the relief layer is removed very completely by the laser, so that intensive subsequent cleaning is not generally necessary. If desired, the printed plate obtained can however also be subsequently cleaned. As a result of such a cleaning step, layer components which have been detached but possibly not completely removed from the plate surface are removed. As a rule, simple spraying with water is entirely sufficient.

The recording elements produced by the novel use of graft copolymers are distinguished by extremely high sensitivity to laser radiation. They can be engraved with lasers considerably more rapidly than conventional flexographic printing plates containing SIS or SBS block copolymers. Alternatively, higher reliefs are obtained with the same engraving speed.

The examples which follow illustrate the invention without restricting its scope.

EXAMPLE 1

A mixture of the following components in water/n-propanol (volume ratio 6:4) was prepared:

| Starting material | source | Part by weight [%] |
|---|---|---|
| Graft copolymer, about 70,000 g/mol, based on polyethylene glycol 35,000 g/mol, 42 mol % of vinyl alcohol/vinyl ester groups, degree of hydrolysis 97% | Alcotex 975 (Harco Chemical) | 36 |
| Graft copolymer, about 62,000 g/mol, based on polyethylene glycol about 25,000 g/mol, 75 mol % of vinyl alcohol/vinyl ester groups, degree of hydrolysis 86% | PVAL 486 (BASF AG) | 9 |
| Phenylglycidyl ether acrylate (monomer) | Laromer LR 8830 (BASF AG) | 43.25 |
| Glycerol (plasticizer) | | 10 |
| Inhibitor for thermal polymerization | Kerobit TBK (BASF AG) | 0.5 |
| Photoinitiator | Irgacure 651 (Ciba) | 1.2 |
| Dye | Brilliant Blue R | 0.05 |

After a homogeneous solution was obtained, it was degassed and spread on a PET film (Lumirror X 43, 150 μm) by means of a chamber coater. The wet application was chosen so that, after drying (2 hours at 80° C., circulating air), a dry layer thickness of 950 μm was present. The photopolymer layer was provided, by lamination, with a 190 μm thick, transparent PET substrate film which had been provided with an adhesion-promoting coating as described in DE 3045516. By exposure to actinic light (λ=360 nm, UVA lamp from Philipps, TL10 (60 W)) on both sides, the photoactive mixture was polymerized within one minute. A blue but nevertheless clear transparent laser-engravable element was obtained.

Engraving the Laser-Engravable Element by Means of a $CO_2$ Laser

The laser-engravable plate produced was stuck to the cylinder of an ALE laser machine (type Meridian Finesse) by means of a self-adhesive tape and the PET protective film was removed. This machine was equipped with a $CO_2$ laser having a power of 200 W. After adjustment of the focus to the plate thickness, the plate was exposed to laser radiation at a rotational speed of 266 rpm and a feed of 20 μm. Within 30 minutes, a test pattern comprising solid areas and various screen elements of the size of an A4 page was engraved. The height of the relief obtained was 800 μm. The resolution was 60 lines/cm (determined by counting the number under a microscope).

EXAMPLE 2

Production of a laser-engravable element by extrusion using a twin-screw extruder (ZSK 53).

The following mixture was used for the extrusion

| Starting material | source | Part by weight [%] |
|---|---|---|
| Graft copolymer, about 70,000 g/mol, based on polyethylene glycol 35,000 g/mol, 42 mol % of vinyl alcohol/vinyl ester groups, degree of hydrolysis 97% | Alcotex 975 (Harco Chemical) | 36 |
| Graft copolymer, about 62,000 g/mol, based on polyethylene glycol about 25,000 g/mol, 75 mol % of vinyl alcohol/vinyl ester groups, degree of hydrolysis 86% | Mowiol GE 4-86 (Clariant) | 9 |
| Phenylglycidyl ether acrylate (monomer) | Laromer LR 8830 (BASF AG) | 43.25 |
| Glycerol (plasticizer) | | 10 |
| Inhibitor for thermal polymerization | Kerobit TBK (BASF AG) | 0.5 |
| Photoinitiator | Irgacure 651 (Ciba) | 1.2 |
| Dye | Basazol Red 71 P | 0.05 |

The binder was compounded beforehand with the glycerol. This precompounding facilitates troublefree melting of the binders at as low as 120 to 150° and hence processing of the polymers with protection of the product. Photoinitiator, inhibitor and dye were dissolved in the monomer and incorporated into the melt. The homogeneous melt was passed into a calender heated to 100° C., between cover sheet and substrate sheet. The sheets used were the types described in Example 1. The photopolymerization was carried out as described in Example 1. A plate having a total thickness of 2.84 mm was obtained.

Engraving of the Laser-Engravable Element by Means of a $CO_2$ Laser

The plate thus produced was engraved by means of a $CO_2$ laser, in the manner described in Example 1. The resulting height of the relief obtained was 800 μm. The resolution was 60 lines/cm.

EXAMPLE 3

The photopolymeric layer obtained in Example 1 on a PET substrate was provided, by means of lamination, with a flexible metallic substrate (aluminum, thickness 0.25 mm) provided with the adhesion-promoting coating according to Example 1. By exposure to actinic light (λ=360 nm, UVA lamps from Philipps, TL 10 (60 W)) from the top, the photoactive mixture was polymerized. A blue but nevertheless clear, transparent laser-engravable element was obtained.

Engraving of the Laser-Engravable Element by Means of a $CO_2$ Laser

The PET film was removed and the laser-engravable element was engraved by means of a $CO_2$ laser, as described in Example 1.

A relief height of 810 μm was achieved in combination with a resolution of 60 lines/cm.

Comparative Example 1

A plate of a crosslinked, carbon black-filled natural rubber (85% by weight of rubber, 9.5% by weight of carbon black, 5.5% by weight of plasticizer and crosslinking agent) was engraved by means of a $CO_2$ laser in the manner described in Example 1. The resulting height of the relief obtained was 650 μm. The resolution was only 54 lines/cm. Furthermore, the engraved plate had fused edges around the indentations.

Comparative Example 2

A laser-engravable element was produced on the basis of DE-A 197 56 327 from a two-component silicone rubber vulcanizing at high temperature and was engraved by means of a $CO_2$ laser in a manner described in Example 1. The resulting height of the relief obtained was 600 μm. The resolution was only 48 lines/cm. In addition, the edges of line elements were not crisp but frayed.

Engraving of the Laser-Engravable Element by Means of an Excimer Laser

Various laser-engraving elements were engraved using a UV laser at various energy densities. Laser parameters, 10 Hz=cycle frequency, 100 pulses, variable energy density, λ=248 nm. The results are shown in Table 3.

TABLE 3

The depth of engraving for various materials is shown as a function of the energy density of the excimer laser

| Material | 3.5 J/cm$^{2*}$ | 3.0 J/cm$^{2*}$ | 2.5 J/cm$^{2*}$ | 2.0 J/cm$^{2*}$ |
|---|---|---|---|---|
| Example 1 | 185 | 190 | 180 | 165 |
| Example 2 | 185 | 190 | 180 | 165 |
| Ethylene/propylene/ diene rubber + carbon black | 105 | 103 | 102 | 100 |
| Natural rubber and carbon black material from Comparative Example 1 | 75 | 78 | 72 | 67 |
| Commercial photopolymerizable flexographic printing plate comprising styrene/diene block copolymer (nyloflex FAH) | 82 | 78 | 75 | 65 |

The examples and comparative examples show that, with the novel use of the graft copolymers, printing plates having excellent sensitivity to laser radiation are obtained. The laser-engravable elements obtained can be readily engraved both in infrared light by means of a $CO_2$ laser and in ultraviolet light by means of an excimer laser.

At identical laser speed, greater relief heights are obtained in Examples 1 and 2 in the engraving of the materials containing the graft copolymers than in the comparative examples. Greater relief heights are obtained also in comparison with silicone rubber.

In engraving by means of a UV laser, the elements produced with the novel use of graft copolymers prove to be the most easily engravable.

We claim:

1. A process for the production of transparent flexographic printing plates comprising engraving a printing relief in a laser-engravable element with the aid of a laser, the laser-engravable element comprising a crosslinked relief layer which is applied to a dimensionally stable substrate, wherein the relief layer comprises at least one graft copolymer obtained by free radical polymerization of vinyl esters in the presence of polyalkylene oxides and subsequent hydrolysis of at least some of the ester functions of the graft copolymers formed.

2. A process for the production of transparent flexographic printing plates as claimed in claim 1, wherein the graft copolymer is an elastomeric graft copolymer.

3. A process for the production of transparent flexographic printing plates as claimed in claim 1, wherein the crosslinked relief layer is obtained by photochemical crosslinking.

4. A process for the production of transparent flexographic printing plates as claimed in claim 1, wherein the crosslinked relief layer is obtained by thermochemical crosslinking.

5. A process for the production of transparent flexographic printing plates as claimed in claim 1, wherein the laser-engravable element comprises an additional top layer on the crosslinked relief layer.

6. A process for the production of flexographic printing plates by engraving a printing relief in a laser-engravable element with the aid of a laser, the laser-engravable element comprising a crosslinked relief layer which is applied to a dimensionally stable substrate, wherein the relief layer comprises at least one elastomeric graft copolymer obtained by free radical polymerization of vinyl esters in the presence of polyalkylene oxides and subsequent hydrolysis of at least some of the ester functions of the graft copolymers formed and at least one IR absorber.

7. A process for the production of flexographic printing plates as claimed in claim 6, wherein the laser-engravable element comprises an additional top layer on the crosslinked, elastomeric layer.

8. A process for the production of flexographic printing plates by engraving a printing relief in a laser-engravable element with the aid of a laser, the laser-engravable element comprising a crosslinked relief layer which is applied to a dimensionally stable substrate, wherein the relief layer comprises at least one graft copolymer obtained by free radical polymerization of vinyl esters in the presence of polyalkylene oxides and subsequent hydrolysis of at least some of the ester functions of the graft copolymers formed and wherein the dimensionally stable substrate is a metallic substrate.

* * * * *